United States Patent [19]

Seibold et al.

[11] 4,236,948
[45] Dec. 2, 1980

[54] PROCESS FOR DOPING SEMICONDUCTOR CRYSTALS

[75] Inventors: Klaus Seibold, Hanau; Gunther Schlamp, Steinbach, both of Fed. Rep. of Germany

[73] Assignee: Demetron Gesellschaft fur Elektronik Werkstoffe mbH, Hanau, Fed. Rep. of Germany

[21] Appl. No.: 18,881

[22] Filed: Mar. 9, 1979

[51] Int. Cl.³ .......................................... H01L 21/225
[52] U.S. Cl. .................................... 148/188; 148/187
[58] Field of Search ............................... 148/188, 187

[56] References Cited

U.S. PATENT DOCUMENTS

| | | | |
|---|---|---|---|
| 3,084,079 | 4/1963 | Harrington | 148/187 X |
| 3,658,584 | 4/1972 | Schmidt | 148/188 X |
| 3,789,023 | 1/1974 | Ritchie | 148/188 X |
| 3,834,939 | 9/1974 | Beyer et al. | 148/188 X |
| 4,075,044 | 2/1978 | Jager | 148/188 X |

*Primary Examiner*—G. Ozaki
*Attorney, Agent, or Firm*—Cushman, Darby & Cushman

[57] ABSTRACT

Semiconductor crystals, especially silicon semiconductor crystals, are doped using a solution to which there are added a silicon dioxide film forming material, a p or n doping material and organic solvent, by applying this solution to the surface of the semiconductor crystals drying and calcining while forming a cohesive, adhering coating layer, and diffusing the doping material into the semiconductor crystals in the calcining. The improvement is using as the silicon dioxide film forming components acidified solutions of partially hydrolyzed alkyl and/or polysilicates, the solutions having a pH between 2 and 6.

18 Claims, No Drawings

PROCESS FOR DOPING SEMICONDUCTOR CRYSTALS

BACKGROUND OF THE INVENTION

The invention is directed to a process for doping semiconductor crystals, particularly those made of silicon by applying a silicon dioxide additive layer containing dropout additive which by subsequent calcining diffuse into the silicon crystals and thereby according to the doping additive used, according to the duration of diffusion and calcining temperature form p- or n-zones of different, but definite, depths of penetration and with a specific, fixed concentration pattern.

There have already been proposed for carrying out such doping processes several types of preparations which are characterized by different layer forming components. In one case there is used for this purpose colloidal $SiO_2$ which is emulsified in organic solvents together with the doping material. Another preparation utilizes as coating components monosilicon tetra-acetate or monosilicon triacetate with a vinyl group. A further proposal is directed to the use of tetraethyl orthosilicate as coating forming components.

The known doping processes of this type, however, are not sufficiently stable, they flock out after a time of 3 to 6 months as highly viscous materials or gel either through the action of the moisture, which reaches the preparation in repeated opening of the stock flasks, or through internal cross-linking reaction. The thus changed preparations are no longer usable for the described doping process.

If in place of the hydrolysis sensitive coating forming components there are used stable components then it is not possible to use the process in the desired way, i.e. applying a liquid film, which is converted in relatively short time by hydrolysis into a doping material containing silicon dioxide film, since in this case the hydrolysis and the cross-linking reaction only run very slowly or do not start at all.

Therefore it was the problem of the present invention to find a process for doping semiconductor crystals, especially silicon semiconductor crystals, using a solution which contains a silicon dioxide film forming material, n- or p-doping material and organic solvent whereby the film forming material should make possible a sufficient storage stability of the solution and on the other hand after applying on the semiconductor crystal make possible the building of a cohesive silicon dioxide film by the effects of air moisture and connected heating.

SUMMARY OF THE INVENTION

This problem was solved by the invention by using as the silicon dioxide film forming components solutions of partially hydrolyzed alkyl and/or aryl polysilicates, the solution being acidified to a pH between 2 and 6.

It was found that there are preferably suited for this purpose aryl and/or alkyl polysilicates with a chain length of 2–5 silicon units.

As alkyl and or aryl groups there can especially be employed methyl, ethyl, propyl, butyl, phenyl and/or tolyl groups. For example there can be used methyl polysilicates having 2,3,4 or 5 silicon units, ethyl polysilicates having 2,3,4 or 5 silicon units, propyl polysilicates having 2,3,4 or 5 units, butyl polysilicates having 2,3,4 or 5 silicon units, phenyl polysilicates having 2,3,4 or 5 silicon units, tolyl polysilicates having 2,3,4 or 5 silicon units or mixed methyl phenyl polysilicates having 2,3,4 or 5 silicon units.

The amount of coating forming organic polysilicate in the solution is preferably between 10 and 35% by weight. However, there can also be used polymer mixtures having slight amounts of monomers.

The compounds of the invention show high stability against normal air moisture which makes it possible to store them over a long period of time without change in viscosity. If such compounds dissolved in organic solvents are applied as a film to the surface of a crystal then no longer forming reaction occurs. Therefore it is quite necessary to prehydrolyze these organic polysilicates to a specific degree. This is attained by addition of such an amount of water, with simultaneous addition of sufficient acid, e.g. hydrochloric acid or sulfuric acid, to effect a partial degree of hydrolysis of 35 to 90% of the OR groups capable of hydrolysis. R in the formula OR is lower alkyl, phenyl or tolyl. In this manner within several hours a partial hydrolysis of the layer forming components is brought about which causes the hydrolysis to proceed to such an extent that after the application of the air by the normal moisture content of the air a more firmly adhering impervious $SiO_2$ film is formed.

As organic solvents there can be employed known solvents for alkyl and aryl polysilicates. However, there are especially recommended for the process of the invention monohydric and polyhydric alcohols, e.g., alkanols such as methanol, ethanol, isopropanol, ethylene glycol, propylene glycol, glycerine, esters, e.g., ethyl acetate, propyl acetate, methyl acetate and/or ketones, e.g. acetone, methyl ethyl ketone, methyl butyl ketone.

Accordingly the process of the invention consists in using alkyl and/or aryl polysilicates which have already been partially hydrolyzed. There has proven especially favorable a hydrolysis degree of 35 to 90% based on the total amount of hydrolyzable organic silicates. The solutions preferably contain 10 to 35% of the hydrolyzed alkyl and/or aryl polysilicates.

The partial hydrolysis proceeds in a relatively short time, for example in 1 to 2 days, so that with the help of the process of the invention it is now possible to prepare stable preparations for doping with the help of silicon dioxide film forming solutions. It is particularly advantageous in longer storage periods to store the solutions used for the doping in at least two portions separated from each other, whereby one portion contains the non-hydrolyzed layer forming components, in a given case with addition of organic solvent, and another portion contains the doping additives, as well as the necessary amounts of water and hydrogen ions so that the final solution for doping is prepared shortly before its use by combining the separately stored portions in specific proportions, however, at least long enough before use that the partial hydrolysis through the aid of the water and acid can proceed to the stated degree. For this purpose it can be advantageous to color the solution containing the doping material according to the doping material by addition of small mounts of organic dye.

The further working up of the solutions of the invention occurs in known manner, whereby it is suitable to calcine in an oxidizing atmosphere. The process of the invention besides doping with arsenic, phosphorus or boron also can serve for dopings with antimony, zinc, aluminum, platinum, gold and/or gallium containing compounds. Furthermore the preparations of the invention are also capable for use in the production of neutral, i.e., doping agent free, tight and insulating coatings of $SiO_2$ on semiconductor materials. Especially tight coatings at low temperatures then are obtained if there are added to the coating forming components of the invention additions of PbO in an amount of up to 5% of the polysilicate component.

Unless otherwise indicated all parts and percentages are by weight.

The process can comprise, consist essentially of or consist of the steps set forth and the materials employed can comprise, consist essentially of or consist of the material set forth.

What is claimed is:

1. In a process for doping a semiconductor crystal with a solution containing a substance able to form a silicon dioxide film, a p- or n-doping material and an organic solvent by applying this solution to the surface of the semiconductor crystal whereby after drying and calcining there will be formed a cohesive and firmly adhering layer from which layer the doping material will diffuse into the semiconductor crystal during calcination, the improvement comprising employing as the component forming the silicon dioxide layer an acidified solution having a pH 2 to 6 of partially hydrolyzed alkyl polysilicate, aryl polysilicate or mixed alkyl aryl polysilicate.

2. A process according to claim 1 wherein the semiconductor is a silicon semiconductor.

3. A process according to claim 2 wherein the degree of hydrolysis of the layer forming components before using the solution is 35 to 90% based on the total amount of hydrolyzable organic silicate.

4. A process according to claim 3 wherein the polysilicate has 2 to 5 silicon units.

5. A process according to claim 4 wherein the concentration of the polysilicate coat forming components in the solution is between 10 and 35 weight %.

6. A process according to claim 4 wherein the solution for the production of the silicon dioxide coating contains another dopant and lead oxide, the lead oxide being present in an amount up to 5% of the polysilicate.

7. A process according to claim 1 wherein the degree of hydrolysis of the layer forming components before using the solution is 35 to 90% based on the total amount of hydrolyzable organic silicate.

8. A process according to claim 7 wherein the polysilicate has 2 to 5 silicon units.

9. A process according to claim 8 wherein the concentration of the layer forming components in the solution is between 10 and 35 weight %.

10. A process according to claim 1 wherein the concentration of the layer forming components in the solution is between 10 and 35 weight %.

11. A process according to claim 1 wherein the solution for the production of the silicon dioxide coating contains another dopant and lead oxide, the lead oxide being present in an amount up to 5% of the polysilicate.

12. A process according to claim 1 wherein there is employed for the doping a plurality of portions, one of which contains the non-hydrolyzed polysilicate and is free from water and another of which contains the doping additives as well as the amounts of water and hydrogen ion necessary for the partial hydrolysis and the two portions are mixed together shortly before use for doping the semiconductor crystal but long enough before use that partial hydrolysis of the polysilicate occurs to the desired degree before use.

13. A process according to claim 12 wherein the two portions are mixed together sufficiently before using for the doping that the polysilicate is hydrolyzed 35 to 90%.

14. A process according to claim 1 wherein the organic solvent comprises a monohydric alcohol, a polyhydric alcohol, an ester or a ketone.

15. A process according to claim 14 wherein the organic solvent comprises methanol, ethanol, isopropanol, ethylene glycol, propylene glycol, glycerine, ethyl acetate, propyl acetate, methyl acetate, acetone, methyl ethyl ketone or methyl butyl ketone.

16. A process according to claim 14 wherein the dopant comprises a compound of arsenic, phosphorus, boron, antimony, zinc, aluminum, platinum, gold or gallium.

17. A process according to claim 16 wherein the organic solvent is ethyl alcohol and there is employed a 35% hydrolyzed methyl polysilicate having 2 to 5 silicon units at a concentration in the solution of 10 weight %.

18. A process according to claim 16 wherein the organic solvent is ethyl alcohol and there is employed a 90% hydrolyzed methyl polysilicate having 2 to 5 silicon units at a concentration in the solution of 10 weight %.

* * * * *